(12) United States Patent
Chang (10) Patent No.: US 9,665,004 B2
(45) Date of Patent: May 30, 2017

(54) PHOTOSENSITIVE MATERIAL AND METHOD OF LITHOGRAPHY

(71) Applicant: Taiwan Semiconductor Manufacturing Company, Ltd., Hsin-Chu (TW)

(72) Inventor: Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/968,708

(22) Filed: Dec. 14, 2015

(65) Prior Publication Data

US 2016/0097976 A1    Apr. 7, 2016

Related U.S. Application Data

(62) Division of application No. 13/486,697, filed on Jun. 1, 2012, now Pat. No. 9,213,234.

(51) Int. Cl.
*G03F 7/004* (2006.01)
*G03F 7/16* (2006.01)
*G03F 7/11* (2006.01)

(52) U.S. Cl.
CPC .............. *G03F 7/16* (2013.01); *G03F 7/0045* (2013.01); *G03F 7/0046* (2013.01); *G03F 7/11* (2013.01)

(58) Field of Classification Search
None
See application file for complete search history.

(56) References Cited

U.S. PATENT DOCUMENTS

| | | | |
|---|---|---|---|
| 6,420,085 B1 | 7/2002 | Nishi et al. | |
| 6,548,221 B2 | 4/2003 | Uetani et al. | |
| 6,902,862 B2 | 6/2005 | Takahashi et al. | |
| 7,285,369 B2 | 10/2007 | Takahashi et al. | |
| 7,629,108 B2 | 12/2009 | Watanabe et al. | |
| 7,670,751 B2 | 3/2010 | Ohashi et al. | |
| 7,985,534 B2 | 7/2011 | Tsubaki | |
| 8,017,304 B2 | 9/2011 | Taruntani et al. | |
| 8,080,361 B2 | 12/2011 | Takahashi et al. | |
| 8,956,806 B2 | 2/2015 | Wang et al. | |
| 2005/0069819 A1 | 3/2005 | Shiobara | |
| 2007/0059849 A1 | 3/2007 | Op de Beeck | |
| 2007/0092843 A1 | 4/2007 | Yang | |
| 2008/0153036 A1 | 6/2008 | Suetsugu et al. | |
| 2009/0098490 A1 | 4/2009 | Pham et al. | |
| 2009/0133908 A1 | 5/2009 | Goodner et al. | |
| 2010/0143830 A1 | 6/2010 | Ohashi et al. | |
| 2010/0213580 A1 | 8/2010 | Meador et al. | |
| 2010/0261122 A1 | 10/2010 | Iatomi | |
| 2010/0304297 A1 | 12/2010 | Hatakeyana et al. | |
| 2011/0003247 A1 | 1/2011 | Ohashi et al. | |
| 2011/0003250 A1 | 1/2011 | Amara et al. | |
| 2011/0045413 A1 | 2/2011 | Tsubaki | |
| 2012/0052441 A1* | 3/2012 | Sagehashi ............ | C07D 233/60 430/270.1 |
| 2014/0065540 A1* | 3/2014 | Wang .................... | G03F 7/0045 430/281.1 |

FOREIGN PATENT DOCUMENTS

| | | |
|---|---|---|
| JP | 2001147523 | 5/2001 |
| JP | 2002139838 | 5/2002 |
| JP | 2006025172 | 9/2006 |
| JP | 2006251672 | 9/2006 |
| WO | WO 2011111805 | 9/2011 |

OTHER PUBLICATIONS

KR Application No. 1020120101654, Korean Final Rejection Mailed Dec. 23, 2014, 6 pgs.
Machine translation JP 2001-147523 May 29, 2001.
Machine translation JP 2002-139838 May 18, 2002.
Machine translation JP 2006-251672 Sep. 21, 2006.
Hiroto Yukawa; "TOK Resist Development Status for EUVL;" May 23, 2006; pp. 1-11; C/N: 1220605080; TOK Litho Forum; Tokyo Ohka Kogyo Co., Ltd.; Advanced Material Development Division 1; Vancouver, Canada.
Ching-Yu Chang; "Photosensitive Material and Method of Photolithography;" U.S. Appl. No. 13/437,674, filed Apr. 2, 2012; 21 Pages.

* cited by examiner

*Primary Examiner* — Daborah Chacko Davis
(74) *Attorney, Agent, or Firm* — Haynes and Boone, LLP (57) ABSTRACT

Photosensitive materials and method of forming a pattern that include providing a composition of a component of a photosensitive material that is operable to float to a top region of a layer formed from the photosensitive material. In an example, a photosensitive layer includes a first component having a fluorine atom (e.g., alkyl fluoride group). After forming the photosensitive layer, the first component floats to a top surface of the photosensitive layer. Thereafter, the photosensitive layer is patterned.

11 Claims, 4 Drawing Sheets

PHOTOSENSITIVE MATERIAL AND METHOD OF LITHOGRAPHY

PRIORITY DATA

The present application is a divisional application of U.S. patent application Ser. No. 13/486,697, filed Jun. 1, 2012, issuing as U.S. Pat. No. 9,213,234, entitled "PHOTOSENSITIVE MATERIAL AND METHOD OF LITHOGRAPHY", which is hereby incorporated by reference in its entirety.

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods, tools, and materials have struggled to realize the desire for smaller feature sizes.

Lithography is a mechanism by which a pattern is projected onto a substrate, such as a semiconductor wafer, having a photosensitive layer formed thereon. The pattern is typically induced by passing radiation through a patterned photomask. Though lithography tools and methods have experienced significant advances in decreasing the line width of an imaged element, further advances may be desired. For example, the profile of the imaged feature of photosensitive material may lack the fidelity to the pattern required to accurately reproduce the desired pattern on the substrate. For example, unwanted, residual photosensitive material may remain after imaging and development; or portions of the photosensitive material needed to perform as a masking element may be removed or otherwise damaged.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. For example, though described herein as a photolithography method configured to fabricate semiconductor devices, any photolithography method or system may benefit from the disclosure including, for example, for TFT-LCD fabrication, and/or other photolithography processes known in the art.

Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Photosensitive materials are typically used to pattern target layers, for example, provided on a semiconductor substrate, in order to form a device or portion thereof. One photosensitive material is chemical amplify photoresist or CAR. For chemical amplify resist, a photoacid generator (PAG) will become an acid after exposure to radiation. The acid will initiate the leaving of acid labile groups (ALG) of the polymer during the post-exposure bake (PEB) process. The leaving of the ALG will produce an acid for initiating leaving of subsequent ALG from the polymer. Such a chain reaction will be terminated only when the acid produced comes in contact with a base, also referred to as a base quencher or quencher. When the ALG leaves the polymer of the resist, the branch unit of the polymer will be changed to carboxylic group that increases the polymer solubility to a positive tone developer; thus, allowing the irradiated area of the resist to be removed by a developer, while the non-irradiated area remains insoluble and becomes a masking element for subsequent processes. The PAG and the quencher are typically provided in a solvent. (Typical solvents include xylene, acetates, and/or other suitable solvents.) Other components of the photosensitive material may also or alternatively be present including photo base generator (PBG), photo decompose quencher (PDQ), dyes, wetting agents, coating aids, amines, adhesion promoters, and/or other suitable components.

It is desired that the acid produced by the PAG and the base produced by the quencher should be kept in balance to keep the profile of the resultant masking element feature having a fidelity to the pattern including, for example, straight sidewalls. If the acid concentration is too strong, the space dimensions between features (space CD) can become overly large. Conversely, if the quencher loading is too high, the space CD can become too small. Thus, what is needed is a material and method of keeping an acceptable loading between acid and base in the photoresist material to provide pattern fidelity.

Figure 1:
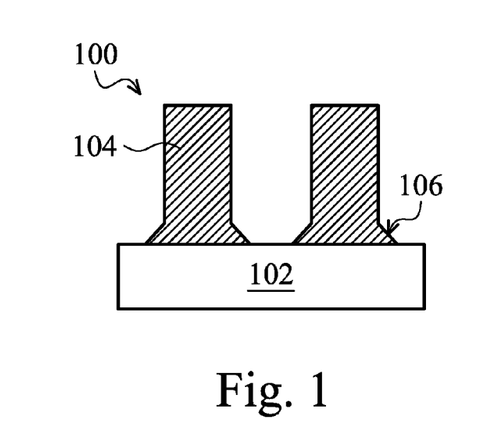
FIGS. 1, 2, 3, and 4 are cross-sectional views of prior art features formed of a photosensitive material
Figure 2:
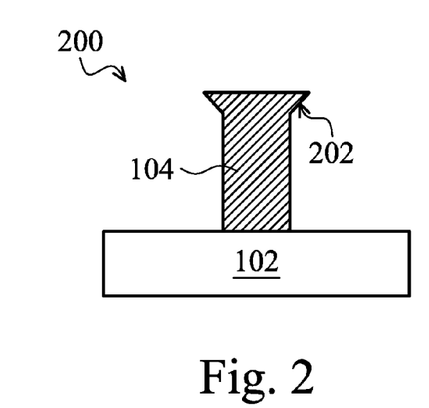
Figure 3:
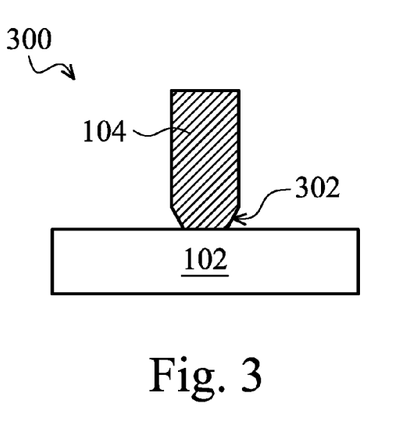
Figure 4:
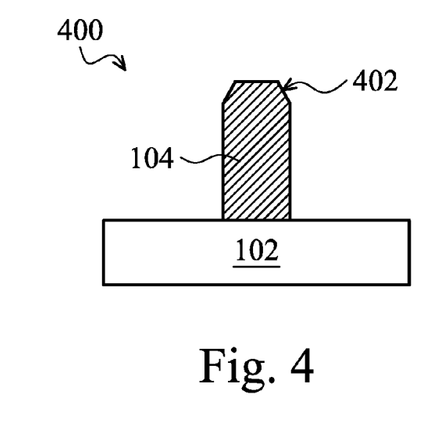

Illustrated in FIGS. 1, 2, 3 and 4 are cross-sectional views of devices having various profile issues of a feature formed on a substrate. Specifically, the feature is a patterned photosensitive layer or photoresist. The resist profile is disadvantageous in each of the devices 100, 200, 300 and 400 due to lack of fidelity to the desired pattern. Device 100, shown in FIG. 1, illustrates a footing profile issue; device 200, shown in FIG. 2, illustrates a T-top profile issue; device 300, shown in FIG. 3, illustrates an undercut profile issue; and device 400, shown in FIG. 4, illustrates a top rounding profile issue. Each profile is caused by an imbalance (e.g., too high or too low relative concentration) in one or more of the chemical components of the photosensitive material at certain regions of a layer (e.g., top or bottom) formed of the material. This imbalance influences the solubility of the photosensitive material the developer, and thus affects the resultant profile. The imbalance in chemical components may include an imbalance in acid including photoacid generator (PAG), base including a quencher, and/or other chemical components. Each profile of FIGS. 1, 2, 3, and 4 is discussed in further detail below.

With respect to FIG. 1, the device 100 illustrates a footing profile issue. When the radiation intensity in the exposure of a photoresist layer is not sufficiently brought to a bottom region of the layer, a footing profile of the patterned feature may result. Similarly, a footing profile may result when there is an insufficient amount of acid (or the acid is captured) at the bottom regions of the photoresist layer, such that residual photoresist remains after development. The device 100 includes a resist feature 104 having a footing profile 106.

Weak radiation intensity at the bottom region of a photoresist layer may be due to radiation being absorbed by the resist; radiation absorbed by the underlying substrate (substrate 102) or radiation absorbed differently by different regions of the underlying substrate; radiation having insufficient intensity at a bottom region of a photoresist layer due to topography of the substrate 102; introduction of poisons from the substrate 102 into the overlying photoresist layer that will reduce the amount of acid; and/or other affects. For example, if the PAG is not initiated due to weak radiation intensity, the CAR reaction will be decreased and the ALG will not leave after PEB. This can impact pattern fidelity by causing a footing profile, such as footing profile 106. In another example, if a portion of the substrate has a lower reflectivity, the resist in and adjacent that area may suffer from a lower radiation intensity and leave a scum or a footing profile such as footing profile 106 (for example, if a portion of the substrate interposing the features 104 has a lower reflectivity, the sidewalls of the features 104 may suffer from a footing profile 106 over that interposing region of the substrate 102). In yet another example, if a trench structure is disposed in the substrate 102 interposing the photoresist features 104, photoresist may not be sufficiently removed from the sidewalls of the trench due to lower radiation intensity reaching the trench area. In another example, the substrate 102 may include a film which can absorb the photo acid and reduce the CAR reaction in the photoresist layer. For example, a nitride film of the substrate 102 may provide a dangling nitrogen bond that can cause the absorption of acid from the photoresist layer.

With respect to FIG. 2, the device 200 illustrates a T-top profile issue (also referred to as a top bridge). The device 200 includes a resist feature 104 having a T-top profile 202. When the PAG concentration is decreased at the top region of a photoresist layer, a T-top profile may result. For example, the PAG concentration may be reduced at a surface of the photosensitive layer due to optical intensity differences between the photoresist center region and photoresist top region; a surface PAG leaching into immersion fluid (e.g., water); an increase in surface quencher concentration; a different photoresist polymer in the top region of the layer as compared to the center region of the layer (e.g., the different photoresist polymers may have a different dissolution rate to a developer); and/or other affects.

With respect to FIG. 3, the device 300 illustrates an undercut profile issue. When the PAG concentration is too great, relatively, at the bottom region of a photoresist layer, an undercut profile may result. The device 300 includes a resist feature 104 having an undercut profile 302. The undercut profile 302 may result from a substrate than has a lower film density that can influence the PAG/quencher loading balance. For example, the substrate 102 may absorb the quencher of the photosensitive layer providing an imbalance in acid/base at the bottom region of the photosensitive layer (e.g., a reduction in the quencher or base concentration). Upon development of the resist, the undercut 302 results. In another example, the substrate 102 may have an additional acid that leaches into the resist and that complements the CAR reaction causing an imbalance in acid/quencher at the bottom region of the photosensitive layer (e.g., increasing the acid concentration). Thus, the undercut 302 to result from an additional acid concentration. In yet another example, if the substrate 102 includes a layer having a different reflectivity (e.g., a film underlying the photoresist feature 104 is higher than the film adjacent the feature 104), the profile of a feature on the higher reflectivity area may become undercut due to the stronger optical intensity provided by the increased reflectivity.

With respect to FIG. 4, the device 400 illustrates a top-rounding profile issue. When the PAG concentration is higher than a quencher concentration in a top region of the photoresist layer, the profile of the resultant feature will exhibit a top-rounding effect. The device 400 includes a resist feature 104 having a top-rounding profile 402. The top-rounding profile 402 may be caused by various configurations of the photosensitive material from which the resist feature 104 is patterned. For example, when the photoacid generator (PAG) concentration is higher than a quencher concentration in a top region of a photosensitive layer, the top-rounding profile 402 may result. Acid contamination from an overlying layer (e.g., an immersion top coat or top antireflective coating (TARC) film) may increase the acid concentration in a top region of the photosensitive layer, which also may result in a top-rounding profile such as the top-rounding profile 402. In using immersion lithography, if the immersion fluid (e.g., water) is absorbed by the photosensitive material, the fluid (e.g., water) can change the acid diffusion length and also affect the profile. If the acid has a high diffusion length, the line-width profile will become thinner or a top-rounding profile may result.

The present disclosure discusses several methods and compositions that may be used to provide adequate balancing between acid or PAG loading and base or quencher loading. These methods and/or compositions may be used in combination, or separately to pattern a substrate such as a semiconductor wafer. It is noted that although a method or composition may be discussed as targeting a specific issue, such as a specific profile issue, the method and/or composition is not so limited and one of ordinary skill would recognize other applications which would benefit from the disclosure.

Figures 5, 6, 7:
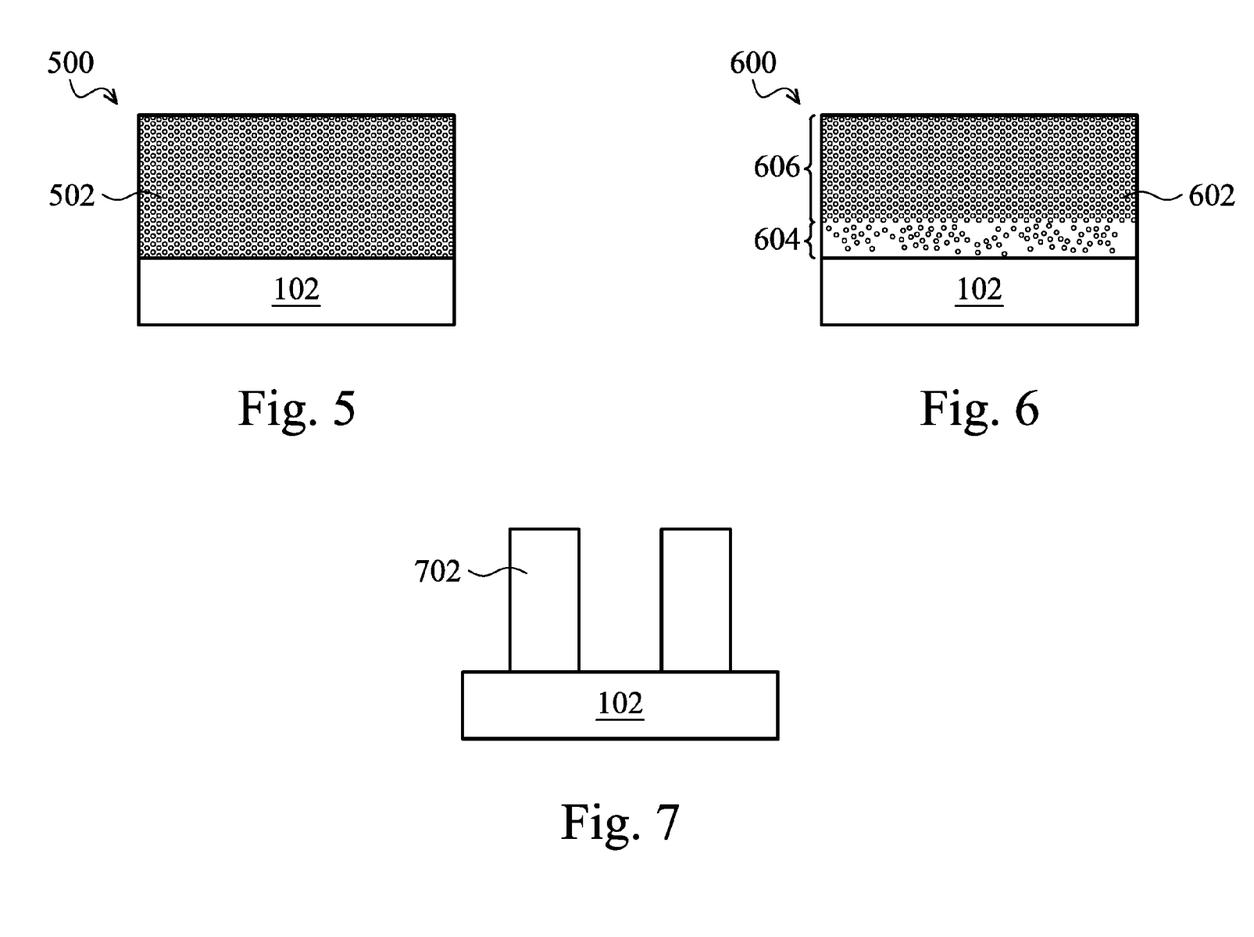
FIGS. 5-9 are cross-sectional views of exemplary embodiments devices fabricated according to one or more aspects of the present disclosure.

In an embodiment, a photosensitive material is deposited having a uniform composition such as illustrated in FIG. 5 by device 500 having photosensitive material 502. The photosensitive material 502 is disposed on a substrate 102. The substrate 102 may be a semiconductor substrate (e.g., wafer). In an embodiment, the substrate 102 is silicon in a crystalline structure. In alternative embodiments, the substrate 102 may include other elementary semiconductors such as germanium, or includes a compound semiconductor such as, silicon carbide, gallium arsenide, indium arsenide, and indium phosphide. The substrate 102 may include a silicon on insulator (SOI) substrate, be strained/stressed for performance enhancement, include epitaxially grown regions, include isolation regions, include doped regions, include one or more semiconductor devices or portions thereof, include conductive and/or insulative layers, and/or include other suitable features and layers. In an embodiment, the substrate 102 includes antireflective coatings, hard mask materials, and/or other target layers for patterning by the photosensitive layer 502. In an embodiment, the substrate 102 is typical of a CMOS process technology. However, though processing a substrate in the form of a semiconductor wafer may be described, it is to be understood that other examples of substrates and processes may benefit from the present invention such as, for example, printed circuit board substrates, damascene processes, and thin film transistor liquid crystal display (TFT-LCD) substrates and processes.

The photosensitive material 502 may be positive tone or negative tone resist. In an embodiment, the photosensitive material 502 is chemical amplified resist (CAR). As illustrated in FIG. 5, the photosensitive material 502 is substantially uniform distribution of quencher and/or acid. For example, the photosensitive material 502 may illustrate the material as initially deposited (e.g., seconds or fractions of sections). However, due to the issues discussed above with respect to FIGS. 1-4, it may be desired for this normal distribution to be altered.

In FIG. 1 described above, a resist feature 104 having a footing profile 106 is described. One compensation for such a profile is reducing the concentration of base or quencher present at the bottom region of a photosensitive material layer after forming the layer and prior to processing or patterning the layer (e.g., prior to exposure, etc). Such compensation may increase the concentration of base or quencher present at the top region of a photosensitive material layer.

In an embodiment, if the quencher is modified to have a composition such that it will "float" or otherwise move towards a top surface of the photosensitive material, it will reduce the quencher component available at the bottom region of the photosensitive layer. This is illustrated by the device 600 of FIG. 6 and the photosensitive layer 602. The quencher (illustrated by the dots) has moved to an upper region 606 of the photosensitive layer 602 leaving a lower region 604 with a reduced quantity of quencher. This "floating" or movement of a quencher towards a top surface can be accomplished in several ways. It is noted that this "floating" may occur automatically due to the composition of the photosensitive materials and/or components of the material (e.g., quencher formula) as discussed below. The "floating" may occur substantially immediately after forming the layer (e.g., 0.1 second).

In an embodiment, a fluorine atom(s) is introduced to the quencher structure. In another embodiment, another inert, relatively light atom is introduced instead of or in addition to fluorine. The fluorine atom(s) may be provided as an alkyl fluoride ($C_xF_y$). In an embodiment, the x coefficient in CxFy is between 1 and 10. In an embodiment, the alkyl fluoride may include $CF_3$, $C_2F_5$, $C_3F_7$, and/or other suitable groups. Exemplary embodiments of photosensitive material compositions including quencher structure formulas, which may result in the configuration of device 600 of FIG. 6 are discussed below. The fluorine or other inert atom may cause the component to which it is linked to "float" to an upper portion of a layer as formed, as discussed above.

In an embodiment, the quencher has the formula where $R^3$ includes a fluorine atom or alkyl fluoride. In an embodiment, the $R^3$ includes an alkyl fluoride $C_xF_y$ where x is between 1 and 10. In an embodiment, the alkyl fluoride may include $CF_3$, $C_2F_5$, $C_3F_7$, and/or other suitable groups. $R^3$ may be an alkyl group a plurality of carbon atoms (e.g., x between of 1 to 10) with a straight, branched or cyclic structure. The alkyl group may also include a hetero atom, such as nitrogen or oxygen.

In another embodiment, the quencher has the formula where $R^4$, $R^5$, and/or $R^6$ include a fluorine atom or alkyl fluoride. $R^4$, $R^5$, and/or $R^5$ may be an alkyl group a plurality of carbon atoms (x of 1 to 10) with a straight, branched or cyclic structure. In an embodiment, the $R^4$, $R^5$, and/or $R^5$ include an alkyl fluoride $C_xF_y$. In an embodiment, x is between 1 and 10. In an embodiment, the alkyl fluoride may include $CF_3$, $C_2F_5$, $C_3F_7$, and/or other suitable groups. The alkyl group may also include a hetero atom, such as nitrogen or oxygen.

In an embodiment, the quencher has the formula where $R^{12}$ includes a fluorine atom or alkyl fluoride. $R^{12}$ may be an alkyl functional structure having a plurality of carbon atoms (x of 1 to 10) with a straight, branched or cyclonic structure. In an embodiment, the $R^{12}$ include an alkyl fluoride $C_xF_y$ where x is between 1 and 10. In an embodiment, the alkyl fluoride may include $CF_3$, $C_2F_5$, $C_3F_7$, and/or other suitable groups.

In an embodiment, the quencher has the formula where at least one of the R groups includes a fluorine atom or alkyl fluoride. At least one of the R groups may be an alkyl functional structure having a plurality of carbon atoms (x of 1 to 10) with a straight, branched or cyclonic structure. In an embodiment, at least one of the R groups includes an alkyl fluoride $C_xF_y$ where x is between 1 and 10. In an embodiment, the alkyl fluoride may include $CF_3$, $C_2F_5$, $C_3F_7$, and/or other suitable groups.

In an embodiment, the quencher has the formula:

where at least one of the R groups includes a fluorine atom or alkyl fluoride. At least one of the R groups may be an alkyl functional structure having a plurality of carbon atoms (x of 1 to 10) with a straight, branched or cyclonic structure. In an embodiment, at least one of the R groups includes an alkyl fluoride $C_xF_y$ where x is between 1 and 10. In an embodiment, the alkyl fluoride may include $CF_3$, $C_2F_5$, $C_3F_7$, and/or other suitable groups.

In an embodiment, the quencher copolymers with another polymer(s) ("associated polymer") and modification of the associated polymer(s) is sufficient to provide movement or floating of the quencher. For example, in an embodiment the copolymer formula is provided. The polymer unit y may provide the quencher. The polymer unit x may provide the floating performance control. The polymer unit z may provide the developer solubility control. Thus, modification of R1 or R5 to include a fluorine atom (such as an alkyl fluoride) may allow for the quencher distribution to increase at a top surface and/or decrease at a bottom region of a deposited layer.

In an embodiment, a fluorine (alkyl fluoride) is linked to the polymer unit x, which is then referred to as the floating polymer unit. In such an embodiment, the floating polymer unit x may be between 3% and 90% of the copolymer. In an embodiment, the polymer unit x may be between 30% and 70% of the copolymer. R1 may include a fluorine atom. The R1 fluorine may include CmFn functional group. In an embodiment, m is between 1 and 10.

The functional group R5 may provide for solubility control. In an embodiment, R5 includes a lactone structure, alcohol structure, carboxylic structure and/or other structure for example providing hydrophilic-nature to developer and water. The quencher structure y may also include R2, R3 and R4 functional group. R2, R3 and R4 may include H or alkyl groups. The alkyl groups may include carbon chain that is straight, branched or cyclic in structure. In an embodiment, the carbon chain includes between 1 and 10 carbon atoms. The alkyl group may also include nitrogen or oxygen hetero atom. In an embodiment, the alkyl group includes a double bond alkyl structure.

In another embodiment, a solvent of the photosensitive material is provided such that it has a higher affinity to the quencher structure. The quencher may have a higher volatility. Thus, the quencher may float to a top region of the photosensitive material layer after formation, for example, during solvent evaporation.

In yet another embodiment, a quencher composition may provide for a different polarity and/or affinity to another polymer of the photosensitive material. Thus, when the associated polymer moves (e.g., floats) to a region of the layer, the quencher may also move to the region. This may allow other polymers to be modified, while maintaining a quencher formulation.

The embodiments discussed above may serve to improve the profile issues discussed, for example the footing profile 106 of the device 100 of FIG. 1 and/or the top rounding profile 402 of the device 400 of FIG. 4. For example, the floating quencher increases the base amount in the top profile area of a formed photoresist feature, thus compensating for a stronger relative acid loading in that region. Thus, as a result of the device 600 illustrated in FIG. 6, a straight wall feature such as feature 702 of FIG. 7 may be provided.

In addition to or in lieu of the photosensitive material compositions above that allow for a base or quencher to be moved or "floated" to a region (e.g., top surface) of a layer, the following discussion is applied to the photosensitive material and the movement or "floating" of an acid or photoacid generator (PAG) of the photosensitive material.

In FIG. 2 described above, a resist feature 104 exhibits a T-top profile 202. One compensation for such a profile is increasing the concentration of acid present at the top region of a photosensitive material layer after forming the layer and prior to processing the layer (e.g., prior to exposure, etc). In FIG. 3 described above, a resist feature 104 exhibiting an undercut profile 302 is illustrated. One compensation for such a profile is reducing the concentration of acid present at the bottom region of a photosensitive material layer after forming the layer and prior to processing the layer (e.g., prior to exposure, etc).

Figure 8:
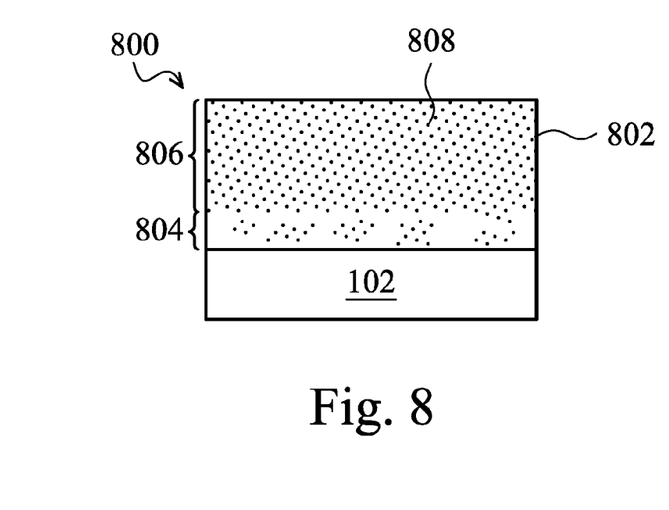
Figure 9:
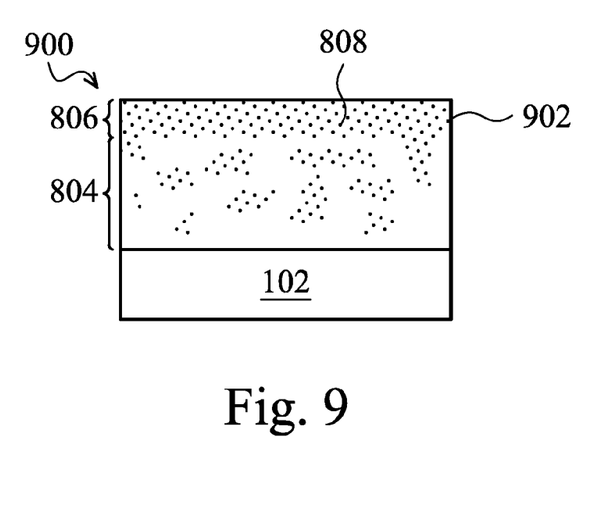

In an embodiment, if the photosensitive material is modified to have a composition such that acid or PAG will "float" or otherwise move towards a top surface of the photosensitive material, it will reduce the PAG component available at the bottom region of the photosensitive layer. This is illustrated by FIG. 8 and the device 800 having a photosensitive layer 802. The acid or PAG (illustrated by the dots 808) has moved to an upper region 806 of the photosensitive layer 802 leaving a lower region 804 with a reduced quantity of acid or PAG. This is also illustrated by FIG. 9 and the device 900 having a photosensitive layer 902. The acid or PAG (illustrated by the dots 808) has moved to an upper region 806 of the photosensitive layer 802 leaving a lower region 804 with a reduced quantity of acid or PAG. Comparing device 900 and device 800, illustrated is that the relative size of regions is dependent upon the concentration and/or composition of the photosensitive material. For example, in an embodiment the top region (e.g., 806) may be approximately 80% of the layer. In another embodiment, the top region (e.g., 806) may be approximately 20% of the layer. Any configuration is possible and within the scope of the present disclosure. (It is noted that while illustrated as two "regions," the concentration of the component may be gradated.) The "floating" or movement of an acid or PAG towards a top surface can be accomplished in several ways. It is noted that this "floating" may occur automatically due to the composition of the photosensitive materials and/or components of the material (e.g., PAG or acid formula). The "floating" may occur substantially immediately after forming the layer (e.g., 0.1 second).

In an embodiment, a fluorine atom(s) is introduced to the acid or PAG structure. In another embodiment, another inert, relatively light atom is introduced instead of or in addition to fluorine. The fluorine atom(s) may be provided as an alkyl fluoride ($C_xF_y$). In an embodiment, the alkyl fluoride may include $CF_3$, $C_2F_5$, $C_3F_7$, and/or other suitable groups. Exemplary embodiments of photosensitive material compositions including acid or PAG formulas, which may result in the configuration of device 800 and/or 900 are discussed below.

In an embodiment, the PAG has the formula where R1' is an anion unit. R1' may be a linear structure, a branch structure, a cyclic structure and/or other suitable structure. At least one alkyl fluoride functional unit is linked to the R1' group. The alkyl fluoride functional group may assist in floating the acid to a top region of an as-formed layer. In an embodiment, the alkyl fluoride may include $CF_3$, $C_2F_5$, $C_3F_7$, and/or other suitable groups. In an embodiment, the alkyl fluoride includes at least two carbon atoms. In an embodiment, $C_2F_5$ is provided in R1'. In an embodiment, two alkyl fluoride groups are included in R1'. In an embodiment, the alkyl fluoride group is linked to one of the —$CH_2$— groups for floating improvement.

The R2, R3, and R4 groups in the PAG above may each be independently hydrogen or a straight, branched, or cyclic monivalent C1-C20 hydrocarbon groups. In an embodiment, the R2, R3, R4 include an alkyl group or alkoxy group, which may include a heteroatom. Examples of hydrocarbon groups including a heteroatom include but are not limited to methyl, ethyl, propyl, isopropyl, n-hexyl, sec-butyl, tert-butyl, tert-amyl, n-pentyl, cyclopentyl, and/or other hydrocarbons. Further description of PAG components is provided in U.S. Pat. No. 7,670,751, which is hereby incorporated by reference.

In an embodiment, the PAG has the formula

The PAG may be a linear anionic PAG. As illustrated, the anionic unit is $C_4F_9SO_3$—; however other compositions are possible. In an embodiment, to improve the floating ability of the PAG, the carbon fluoride concentration is increased for example to $C_5F_{11}SO_3$—.

In an embodiment, the PAG of the photosensitive material has the formula

The PAG may be a linear anionic PAG. $R^1$ may be straight, branch, cyclic and/or other structure. In an embodiment, the n unit of the —$(CH_2)n$— may be between 1 and 10. $R^2$, $R^3$, $R^4$ may be benzyl group or benzyl group with substitutes. For example, the cation ($R^2$, $R^3$, $R^4$) may be triphenylsolfonium (TPS) or biphenylsolfonium (BPS). To provide floatability to the PAG at least one alkyl fluoride functional unit is linked to $R^1$. For example, in an embodiment, $R^1$ is provided with two alkyl fluoride groups attached in a cyclohexane ring having the formula Rf1 and Rf2 may be linked at ortho, meta, and/or para positions to each other in the ring. The alkyl fluoride group may also be attached to the $CH_2$ group. In an embodiment, the alkyl fluoride, Rf1 and/or Rf2, may include $CF_3$, $C_2F_5$, $C_3F_7$, and/or other suitable groups.

In an embodiment, the PAG has the formula

The PAG may be a linear anionic PAG. R may be alkyl or alkyl fluoride. In an embodiment, R includes $C_2F_2$, $C_3F_7$, and/or other suitable group. R may be straight, branch, cyclic with alkyl, or alkyl with O, N, or S hetero atoms, and/or other structure. In an embodiment, the n unit of the —$(CH_2)n$— may be between 1 and 10. The A1 may be an ester bond, ether bon, thioether bond, amid bond, carbonate bond, and/or other suitable bond. $R^2$, $R^3$, $R^4$ may be benzyl group or benzyl group with substitutes. For example, the cation ($R^2$, $R^3$, $R^4$) may be triphenylsolfonium (TPS) or biphenylsolfonium (BPS). For floating ability, alkyl fluoride may be attached to the R group (e.g., at least two alkyl fluorides). For example, an alkyl fluoride attached anionic PAG may include the formula or alternatively the formula where each of the above formulas has two alkyl fluorides attached in admantyl group to provide additional floating properties for the component. The attached position of the alkyl fluoride groups in the formulas varies based on suitable design choices.

In the embodiments of PAG discussed above, an anion unit is provided that includes a fluorine atom or alkyl fluoride group. This may enhance floatability of the PAG. Alternatively, and/or additionally, a cation structure may be provided that includes a fluorine atom or alkyl fluoride group. This may also enhance floatability of the PAG. Exemplary embodiments are discussed below.

In an embodiment, a TPS or BPS cation is modified to include a fluorine atom. For example, in an embodiment, at least two alkyl fluoride groups are synthesized onto a TPS or BPS structure. The alkyl fluoride groups may be linked to a benzyl group.

For example, in an embodiment, the PAG has the formula

As illustrated, the PAG includes alkyl fluoride groups linked to cation PAG. The alkyl fluoride groups may include any alkyl fluoride CxFy where x is between 1 and 10. In an embodiment, the alkyl fluoride may include $CF_3$, $C_2F_5$, $C_3F_7$, $C_4F_9$, and/or other suitable groups.

In another example, in an embodiment, the PAG has the formula

As illustrated, the PAG includes alkyl fluoride groups linked to cation PAG. The cation PAG includes an alkyl group. The alkyl fluoride groups may include any alkyl fluoride $C_xF_y$, where x is between 1 and 10. In an embodiment, the alkyl fluoride may include $CF_3$, $C_2F_5$, $C_3F_7$, $C_4F_9$, and/or other suitable groups.

The embodiments discussed above provide for fluorine or alkyl fluoride groups to be linked to a PAG component. In certain embodiments, the alkyl fluoride group is linked to the anion unit. In other embodiments, the alkyl fluoride group is liked to the cation group. The addition of the alkyl fluoride group may serve to modify the distribution of the PAG component in the as-formed photosensitive material layer. This may be used to improve the profile issues discussed, for example the undercut profile 302 of the device 300 of FIG. 3 and/or the T-top profile 202 of the device 200 of FIG. 2. For example, the floating PAG increases the acid amount in the top profile area of a formed photoresist feature thus compensating for a stronger acid loading in that region. Thus, as a result a straight wall feature such as feature 702 of FIG. 7 may be provided.

In an embodiment, more than one composition of PAG may be provided in a photosensitive material. The compositions of the PAG may vary and/or be directed to specific functions. For example, in an embodiment, a PAG with an alkyl fluoride group linked thereto is provided for floating purposes and a conventional PAG is also included in the photosensitive material.

It is noted that the quencher and/or PAG compositions discussed above provide exemplary embodiments only and are not intended to be limiting to the application of the present disclosure. For example additional structures which may benefit from the substitution and/or provision of fluorine and/or alkyl fluoride groups now known or later developed may be recognized. Various examples are provided, for example, in U.S. Patent Application No. 2008/0153036, which is hereby incorporated by reference.

Similarly, the present disclosure is not limited to quencher or PAG compositions, but to various components included in photosensitive material. These components include, for example, photo base generators (PBG), photo decompose quenchers (PDQ) and/or other components. In an embodiment, nitrogen containing organic base compounds may be provided that include alkyl fluoride groups for improved floating properties. Further examples are provided in U.S. Patent Application 2010/0304297 which is hereby incorporated by reference and describes components that may be modified to include alkyl fluoride groups as discussed herein.

Yet another application of the present disclosure is a treatment method that is capable of reducing the so-called side lobe printing out phenomena. As the critical dimensions of devices shrink, this reduces the process window for lithography and makes the lithography process more challenging to produce an adequate resist features. For example, small features in a pattern can cause a side lobe effect, which results in undesired features being imaged onto a substrate. During irradiation of a main feature intended to printed on to the substrate, the side lobe effect may provide for a radiation, though weaker than the main imaged features, to be incident on the substrate in unwanted areas. This provides for a small amount of photoacid to be generated (e.g., near the surface of the photoresist layer) in unwanted areas. This photoacid is undesirable because left untreated, it will form unwanted features in the developed resist.

Thus, the present methods and compositions may be provided to neutralize the unwanted acid. For example, an additional floating base component in the photosensitive material may serve to quench the acid created in the side lobe phenomena. The acid may be quenched by providing a floating quencher, a floating amine component, a floating PDQ, a floating PBG, and/or other basic component.

Figure 10:
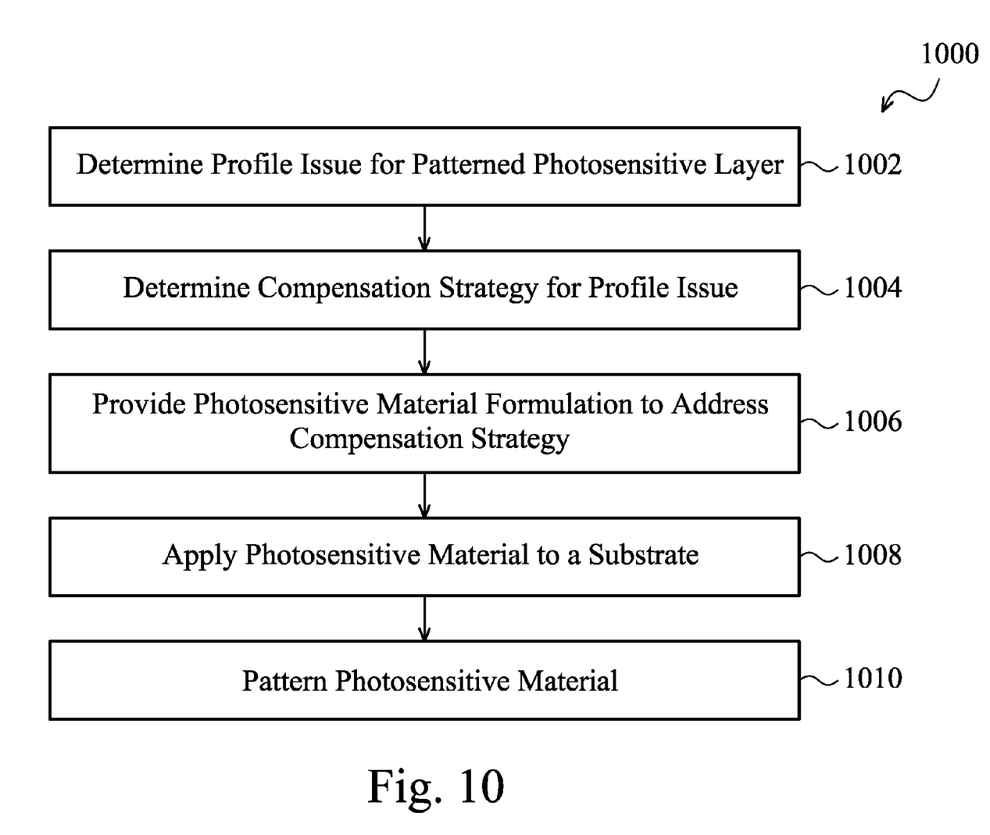
FIG. 10 is a flow chart illustrating an embodiment of a method of forming a patterned layer on a substrate according to one or more aspects of the present disclosure.

Referring now to FIG. 10, illustrated is a method 1000 that provides a method of forming a pattern in a photosensitive material layer. The method 1000 begins at block 1002 where a profile issue for a resultant photosensitive layer is determined. The profile issue may be substantially similar to one or more of the profiles discussed above with reference to FIGS. 1-4. For example, in an embodiment, the photosensitive layer is determined to have a footing issue (see, e.g., the device 100 described above with reference to FIG. 1). In an embodiment, the photosensitive layer is determined to have a T-top profile issue (see, e.g., the device 200 described above with reference to FIG. 2). In an embodiment, the photosensitive layer is determined to have an undercut profile issue (see, e.g., the device 300 described above with reference to FIG. 3). In an embodiment, the photosensitive layer is determined to have a top rounding profile issue (see, e.g., the device 400 described above with reference to FIG. 4).

The profile issue may arise from the photosensitive material, the photolithography equipment, the underlying layer(s) such as a bottom antireflective coating, the overlying layer(s) such as a top antireflective coating, the pattern type (e.g., aspect ratio), and/or other factors such as those discussed above with reference to FIGS. 1-4. The profile issue may be determined from test chips, previous product results, simulation results, data analysis, and/or other suitable methods. It is noted that the profile issue is determined prior to the formation of the layer on the device describes in the method 1000.

The method 1000 then proceeds to block 1004 where the compensation strategy is determined. The compensation strategy may include alterations to the photosensitive material composition to provide for reduction and/or correction of the profile issue described above. For example, the compensation strategy may be provided to increase the fidelity of the patterned photosensitive layer and/or provide an improved lateral sidewall of a feature of the patterned photosensitive layer. In an embodiment, the compensation strategy includes increasing or decreasing acid or PAG concentration at one portion (e.g., upper or lower) of the deposited photosensitive layer. In an embodiment, the compensation strategy includes increasing or decreasing the quencher or base concentration at one portion (e.g., upper or lower) of the deposited photosensitive layer.

The method 1000 then proceeds to block 1006 where a photosensitive material formulation (e.g., composition) is determined and provided to address the compensation strategy. In an embodiment, a photosensitive material formulation to provide for increased acid or PAG at a top portion of a deposited photosensitive material layer is determined. In an embodiment, a photosensitive material formulation to provide for increased acid or PAG at a bottom portion of a deposited photosensitive material layer is determined. In an embodiment, a photosensitive material formulation to provide for increased base or quencher at a top portion of a deposited photosensitive material layer is determined. In an embodiment, a photosensitive material formulation to provide for increased base or quencher at a bottom portion of a deposited photosensitive material layer is determined.

The photosensitive material composition or formulation provided in block 1006 may be substantially similar to the compositions discussed above with reference to FIGS. 5, 6, 7, 8, and 9 and the accompanying description(s).

The method 1000 then proceeds to block 1008 where the photosensitive material is applied to a substrate. The photosensitive material applied may include the formulation developed in block 1006 of the method 1000, described above.

The substrate may be a semiconductor substrate (e.g., wafer). In an embodiment, the substrate is silicon in a crystalline structure. In alternative embodiments, the substrate may include other elementary semiconductors such as germanium, or includes a compound semiconductor such as, silicon carbide, gallium arsenide, indium arsenide, and indium phosphide. The substrate may include a silicon on insulator (SOI) substrate, be strained/stressed for performance enhancement, include epitaxially grown regions, include isolation regions, include doped regions, include one or more semiconductor devices or portions thereof, include conductive and/or insulative layers, and/or include other suitable features and layers. In an embodiment, the substrate is typical of a CMOS process technology. However, though processing a substrate in the form of a semiconductor wafer may be described, it is to be understood that other examples of substrates and processes may benefit from the present invention such as, for example, printed circuit board substrates, damascene processes, and thin film transistor liquid crystal display (TFT-LCD) substrates and processes.

The photosensitive material layer may be formed by processes such as coating (e.g., spin-on coating) and soft baking. In an embodiment, the photosensitive material layer is formed on a bottom anti-reflective coating layer (BARC).

The method 1000 then proceeds to block 1010 where the substrate is irradiated. The method may use various and/or varying wavelengths of radiation to expose the energy-sensitive photosensitive layer, described above with reference to blocks 1006 and 1008. In an embodiment, the substrate is irradiated using ultraviolet (UV) radiation or extreme ultraviolet (EUV) radiation. The radiation beam may additionally or alternatively include other radiation beams such as ion beam, x-ray, extreme ultraviolet, deep ultraviolet, and other proper radiation energy. Exemplary radiation includes a 248 nm beam from a krypton fluoride (KrF) excimer laser, a 193 nm beam from an argon fluoride (ArF) excimer laser, and/or other suitable wavelength radiations. In an example, the photo-acid generator (PAG) that generates acid during the exposure process changes the solubility of the exposed/non-exposed material. Lithography processes used to pattern the photosensitive material layer include immersion lithography, photolithography, optical lithography and/or other patterning methods which may transfer a pattern onto the photosensitive layer.

After exposure, a post-exposure bake (PEB) process may be performed. During the baking process, the photoresist layer is provided at an elevated temperature. This may allow more acid to be generated from the photo-generated acids through a chemical amplification process.

The photosensitive material layer, after exposure to a pattern, may be developed. The developing may form a patterned photoresist layer including a plurality of masking elements or features, such as described above with reference to FIG. 7. During the developing process, a developing solution is applied to the photosensitive material layer. In one embodiment, the photosensitive material that was exposed to the radiation is removed by the developing solution (developer). However, a negative-type resist is also possible. The developing solution may be a positive tone developer or negative tone developer. One exemplary developer is aqueous tetramethylammonium hydroxide (TMAH).

The method may proceed to rinsing, drying, and/or other suitable processes. The patterned photosensitive layer may be used as a masking element in performing one or more processes on underlying layers such as etching, ion implantation, deposition, and/or other suitable processes including those typical of a CMOS-compatible process. The photosensitive material layer may be subsequently stripped from the substrate.

In summary, the methods and devices disclosed herein provide for moving a component of a multi-component photosensitive material to a desired region of a layer formed by the photosensitive material. In doing so, embodiments of the present disclosure offer advantages over prior art devices. Advantages of some embodiments of the present disclosure include providing increased fidelity of the pattern and substantially linear sidewalls of a feature patterned from the photosensitive material. For example, acids and/or bases may be moved such that the desired balance between components is provided in a layer prior to patterning. Some embodiments of the present disclosure may also be applied to solve other issues where it may be beneficial for one component to be unequally distributed, or to account for a naturally occurring undesired distribution between components. In one embodiment, a component desired to be positioned near the top of a feature is provided with fluorine atoms such as in the form of alkyl fluoride groups that cause it to "float" to the top of a formed layer. Based on design considerations, the component chosen for "floating" and the quality required may be determined. It is understood that different embodiments disclosed herein offer different disclosure, and that they may make various changes, substitutions and alterations herein without departing from the spirit and scope of the present disclosure. Thus, provided in one embodiment is a photosensitive material including a solvent; a photoacid generator (PAG) component; and a quencher component. At least one of the PAG and the quencher may include an alkyl fluoride group. In another embodiment of a photosensitive material, another component (in addition to or in lieu of PAG or quencher) is determined to "float" to an upper region of an as-formed layer and a fluorine or alkyl fluorine group is included in that component.

In another embodiment, a method of forming pattern on a substrate is provided. The method includes providing a semiconductor substrate and forming a photosensitive layer on the semiconductor substrate. The photosensitive layer includes a first component having a fluorine atom. After forming the photosensitive layer, the first component is floated to a top surface of the photosensitive layer. Thereafter, the photosensitive layer is patterned. The first component may include a photoacid generator (PAG), a quencher, a photo base generator (PBG), a photo decompose quencher (PDQ), an alkyl fluoride group, a $C_2F_5$ group, and/or other suitable components as described above. In yet another embodiment, a method of fabricating a semiconductor device is provided. The method includes determining a profile issue associated with formation of a first feature. A formation is then determined for a photosensitive material to compensate for the determined profile issue. A layer of the photosensitive material is formed having the determined photosensitive material formulation on a substrate. The layer of the photosensitive material is then patterned to provide the first feature.

What is claimed is:

1. A method used during fabrication of a semiconductor device, comprising:
    prior to the formation of a first feature, determining a profile issue associated with formation of the first feature to be formed using a first photosensitive material formulation, wherein the profile issue is one of a footing profile issue, a T-top profile issue, an undercut profile issue, and top rounding profile issue;
    determining a modification of the first photosensitive material formulation to compensate for the profile issue, wherein the modification includes adjusting at least one of an acid loading and a base loading of the first photosensitive material formulation to provide a modified photosensitive material thereby mitigating the profile issue, wherein the determining the modification of the first photosensitive material formulation includes providing a formulation including a solvent, a photoacid generator, and a quencher and wherein the quencher has a formula wherein R4, R5 and R6 are alkyl fluoride and one of R4, R5, and R6 is $C_2F_5$;
    forming a layer of the modified photosensitive material on a substrate; and
    after the forming the layer, patterning the layer of the modified photosensitive material using an exposure to a radiation beam and development of the exposed layer of the modified photosensitive material to provide the first feature of the modified photosensitive material, wherein the patterning provides the first feature with straight sidewalls.

2. The method of claim 1, wherein the determining modification of the first photosensitive material formulation includes providing an alkyl fluoride group on at least one component of the photosensitive material, wherein the at least one component is one of an acid structure or a quencher structure, and wherein the alkyl fluoride group provides for increasing the concentration of the at least one component on a top region of the layer of photoresist material.

3. The method of claim 1, wherein the determining the modification of the first photosensitive material formulation includes providing an acid component composition that floats to a top region of the layer of the modified photosensitive material during the forming of the layer of modified photosensitive material.

4. The method of claim 1, wherein the determining the photosensitive material formulation includes providing a base component composition that floats to a top region of the layer of the modified photosensitive material during the forming of the layer of modified photosensitive material.

5. The method of claim 1, wherein the determining the profile issue includes identifying the footing profile issue and wherein the compensation includes adjusting the base loading of the first photosensitive material formulation such that the base loading is increased at a top portion of the first feature.

6. The method of claim 1, wherein the quencher formula increases the base loading in a top portion of the layer of photosensitive material.

7. The method of claim 1, wherein the determining the modification of the first photosensitive material formulation includes providing a quencher having a higher volatility than a solvent of the photosensitive material thereby increasing the base loading at a top portion of the layer of photosensitive material.

8. A method used during fabrication of a semiconductor device, comprising:
    prior to the formation of a first feature, determining a profile issue associated with formation of the first feature to be formed using a first photosensitive material formulation, wherein the profile issue is one of a footing profile issue, a T-top profile issue, an undercut profile issue, and top rounding profile issue;
    determining a modification of the first photosensitive material formulation to compensate for the profile issue, wherein the modification includes adjusting at least one of an acid loading and a base loading of the first photosensitive material formulation to provide a modified photosensitive material thereby mitigating the profile issue, the modified photoresist material providing a formulation including a solvent, a photogenerator, a quencher, and an associated polymer that copolymers with the quencher to form a copolymer quencher:
    wherein the copolymer quencher has the formula wherein x, y and z are greater than zero, and wherein R1 is CmFn where m is between 1 and 10 and n is greater than zero, R5 is at least one of a lactone structure, alcohol structure, carboxylic structure, and R2, R3 and R4 each include one of a H or an alkyl group;

forming a layer of the modified photosensitive material on a substrate; and after the forming the layer, patterning the layer of the modified photosensitive material using an exposure to a radiation beam and development of the exposed layer of the modified photosensitive material to provide the first feature of the modified photosensitive material, wherein the patterning provides the first feature with straight sidewalls wherein the copolymer quencher increases the base loading a top portion of the layer of photosensitive material.

9. The method of claim 1, wherein the determining the profile issue includes analysis of test chips, previous product results, simulation results, data analysis, or combinations thereof.

10. The method of claim 8, wherein the determining the profile issue associated with formation of the first feature includes analysis of test chips, previous product results, simulation results, data analysis, or combinations thereof.

11. A method, comprising:

determining a profile issue associated with formation of a first feature to be formed using a photosensitive material, wherein the profile issue is one of a footing profile issue, a T-top profile issue, an undercut profile issue, and top rounding profile issue;

determining a modification of a photosensitive material formulation to compensate for the profile issue, wherein the compensation includes adjusting a base loading of the photosensitive material by providing a modified photosensitive material that includes a solvent, a photoacid generator, and a quencher having an alkyl fluoride group of $C_2F_5$ linked to the quencher;

depositing the modified photosensitive material onto a semiconductor substrate;

while the modified photosensitive material is disposed on the semiconductor substrate, floating the quencher having the alkyl functional group of $C_2F_5$ from a lower region to an upper region of a layer comprising the photosensitive material, wherein the floating quencher has the formula wherein R4, R5 and R6 are alkyl fluoride and one of R4, R5, and R6 is the $C_2F_5$ component;

thereafter, exposing the layer of modified photosensitive material to a radiation beam;

wherein the upper region has a lower amount of acid from the photoacid generator than the lower region after the exposing of the layer; and developing the exposed layer.

* * * * *